United States Patent
Ibrahim et al.

(10) Patent No.: US 9,064,838 B2
(45) Date of Patent: Jun. 23, 2015

(54) HEAT SPREADER FOR INTEGRATED CIRCUIT DEVICE

(71) Applicants: Ruzaini B. Ibrahim, Bandar (MY); Mohd Rusli Ibrahim, Shah Alam (MY); Nor Azam Man, Ampang (MY)

(72) Inventors: Ruzaini B. Ibrahim, Bandar (MY); Mohd Rusli Ibrahim, Shah Alam (MY); Nor Azam Man, Ampang (MY)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/029,779

(22) Filed: Sep. 17, 2013

(65) Prior Publication Data

US 2015/0076680 A1   Mar. 19, 2015

(51) Int. Cl.
H01L 23/34 (2006.01)
H01L 21/56 (2006.01)
H01L 23/433 (2006.01)
H01L 23/498 (2006.01)

(52) U.S. Cl.
CPC .............. *H01L 23/34* (2013.01); *H01L 21/56* (2013.01); *H01L 23/4334* (2013.01); *H01L 23/49816* (2013.01); *H01L 2224/48091* (2013.01); *H01L 2224/73265* (2013.01); *H01L 2924/15311* (2013.01)

(58) Field of Classification Search
CPC .............. H01L 2924/01079; H01L 2924/14; H01L 2924/01029; H01L 2924/01078; H01L 2224/48091
USPC .......... 257/690; 438/107, 110, 113, 122, 127
See application file for complete search history.

(56) References Cited

U.S. PATENT DOCUMENTS

| | | | |
|---|---|---|---|
| 5,917,702 A | 6/1999 | Barrow | |
| 6,146,921 A | 11/2000 | Barrow | |
| 6,432,742 B1 | 8/2002 | Guan | |
| 6,882,041 B1 | 4/2005 | Cheah | |
| 7,126,218 B1 | 10/2006 | Darveaux | |
| 7,420,809 B2 | 9/2008 | Lim | |
| 7,629,674 B1 * | 12/2009 | Foster | 257/659 |
| 8,012,799 B1 * | 9/2011 | Ibrahim et al. | 438/107 |
| 8,183,680 B2 | 5/2012 | Zhao | |
| 2006/0226521 A1 * | 10/2006 | Coyle et al. | 257/666 |
| 2007/0278632 A1 * | 12/2007 | Zhao et al. | 257/676 |
| 2009/0115048 A1 * | 5/2009 | Zhao et al. | 257/690 |
| 2011/0012257 A1 | 1/2011 | Eu | |
| 2012/0050996 A1 * | 3/2012 | Loo | 361/709 |

FOREIGN PATENT DOCUMENTS

WO   WO 2010/117813   * 10/2010

* cited by examiner

*Primary Examiner* — Steven Loke
*Assistant Examiner* — Didarul Mazumder
(74) *Attorney, Agent, or Firm* — Charles Bergere

(57) ABSTRACT

A BGA type packaged integrated circuit (IC) die has an exposed coronal heat spreader. The die, which is attached to a substrate, is encapsulated in a central segment of molding compound. The central segment is laterally surrounded by, and separated by a moat from a ring segment of molding compound, to a form a slot. The coronal heat spreader is inserted into the slot to cap the central segment. The coronal heat spreader is attached to the substrate and to the central segment with thermal glue. In operation, at least some of the heat generated by the die is dissipated through the coronal heat spreader.

14 Claims, 3 Drawing Sheets

HEAT SPREADER FOR INTEGRATED CIRCUIT DEVICE

BACKGROUND OF THE INVENTION

The present invention relates to integrated circuit (IC) packaging, and more particularly, to heat spreaders for ball grid array (BGA) and similar IC packages.

In order to assemble or package an integrated circuit device, an IC die is attached to, and electrical conductors connect the die to, a lead frame or a substrate. The assembly is then partially encapsulated in molding compound to make the packaged IC device that is ready for mounting on a circuit board. The packaging serves several functions including protecting the IC die against potentially harmful external forces and substances. Since a die generates heat during operation and since excess heat can damage the die and other device components, the packaging should also be able to dissipate heat from the die to the exterior of the device. Heat spreaders, which are relatively highly thermo-conductive structures— conventionally made of metal, such as, for example, copper— may be used to assist in the dissipation of heat from a die.

In a typical ball grid array (BGA) device, the die is attached to one side of a planar laminate substrate and encapsulated in molding compound. On the other side of the substrate, there is a grid of connection pads to which are attached solder balls for mounting the packaged device on a circuit board. Several conventional ways of incorporating a heat spreader into a BGA packaged device are known.

For example, U.S. Pat. No. 6,432,742 to Guan et al. ("Guan") teaches assembling a BGA device with a thin heat spreader embedded in the molding compound. The particular heat spreader used in Guan and its attachment to other packaged device components results in tight dimensional tolerance requirements for packaged device elements, which may increase production costs.

In another example, U.S. Pat. No. 7,126,218 to Darveaux et al. ("Darveaux") teaches using a heat spreader attached directly to the surface of the die in a BGA package. The heat spreader of Darveaux conforms generally to the topological profile of the die, underlying substrate, and bond wires interconnecting the die and the substrate. The molding compound encapsulant completely covers the heat spreader and die, which may reduce thermal conduction efficiency since conventional molding compound is significantly less thermo-conductive than metal.

BRIEF DESCRIPTION OF THE DRAWINGS

Embodiments of the present disclosure are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 2:
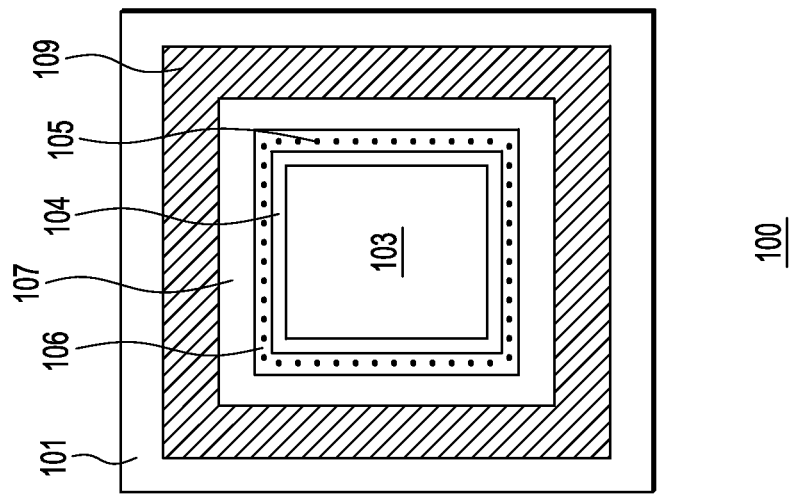
FIG. 2 shows a top cross-sectional view of the packaged device of FIG. 1 along the plane indicated by the dashed line of FIG. 1.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

One embodiment of the present invention is a packaged integrated circuit (IC) device comprising a substrate, a die attached to the substrate, a heat spreader having a lower segment and an upper segment, a central segment of molding compound encapsulating the die and attached to the substrate, and a ring segment of molding compound attached to the substrate. The central segment of molding compound is substantially separated from the ring segment of molding compound by the lower segment of the heat spreader. The upper segment of the heat spreader forms part of the exterior of the packaged device.

Another embodiment of the present invention is a method for packaging an integrated circuit (IC) device, the method comprising attaching a die to a substrate, encapsulating the die with a central segment of molding compound also attached to the substrate, forming a ring segment of molding compound attached to the substrate where the ring segment is separated from the central segment by a moat-like trough, and attaching a heat spreader having a lower segment and an upper segment, where the lower segment substantially fills the slot and the upper segment forms part of the exterior of the packaged device.

In one embodiment, a die, together with bond wire interconnects to a corresponding substrate, is encapsulated in a central segment of molding compound while a concentric ring of encapsulant is also formed and attached to the substrate so that a moat-like trough, or slot, is formed between the central segment and the ring segment of molding compound. Note that molding compound is sometimes also referred to as encapsulant, plastic, and/or epoxy. The slot is shaped to match the lower section of a metallic crown-like heat spreader, referred to herein as a coronal heat-spreader.

The height—and, consequently, volume—of the central segment of molding compound is minimized in order to maximize the size of the coronal heat spreader and reduce the volume of relatively thermo-conductively inefficient molding compound that heat dissipating from the die travels through. In other words, the more metal and less molding compound that separates the die from the surrounding atmosphere, the more efficient is the overall thermal conductivity of the package and, consequently, there is a thermal benefit to reducing molding compound volume and increasing metal volume. The coronal heat spreader may also be referred to, for example, as a drop-in heat spreader since it is inserted into the slot formed by the molding compound segments, a lid since it functions like a lid atop the central segment of molding compound, or a cap since it caps the central segment of molding compound. The upper segment of the coronal heat spreader forms part of the exterior of the packaged device and may be, for example, flat, corrugated, finned, solid, or punctured.

Figure 1:
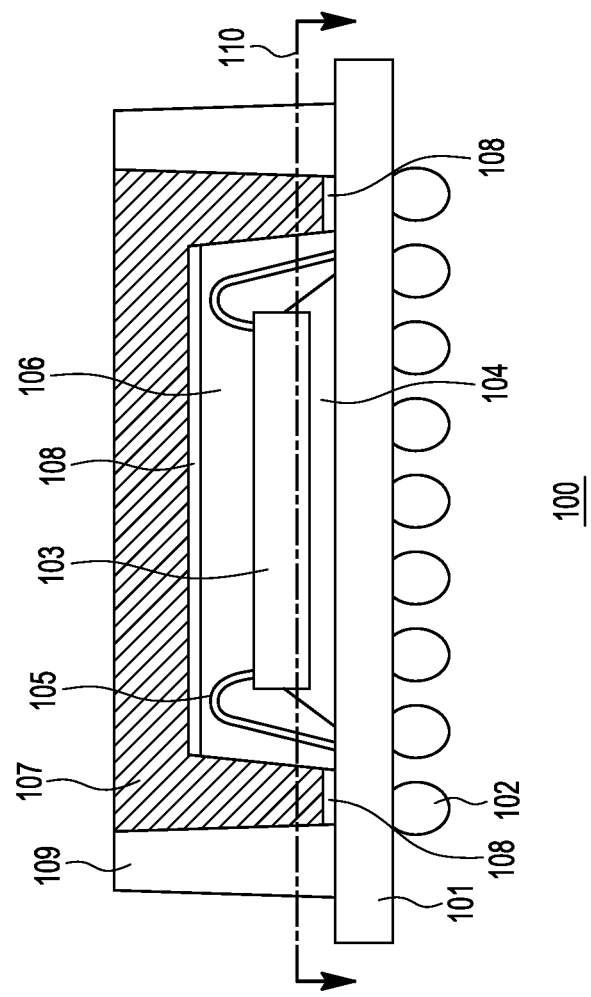
FIG. 1 shows a cross-sectional side view of an exemplary packaged IC device in accordance with one embodiment of the present invention.

FIG. 1 shows a cross-sectional side view of an exemplary packaged IC device 100 in accordance with one embodiment of the present invention. A substrate 101 may be considered the foundation of the packaged device 100. Solder balls 102 are attached to connection pads (not shown) on the bottom of the substrate 101. An IC die 103 is attached to the other side of the substrate 101 with a die-attach adhesive 104. The die 103 is electrically connected to connection pads (not shown) on the top of the substrate 101 with bond wires 105. The connection pads on the top of the substrate 101 are connected to the connection pads on the bottom of the substrate 101 with conductive vias (not shown) through the substrate 101.

The die 103, together with the die-attach adhesive 104 and the bond wires 105 are encapsulated in a central segment 106 of a molding compound. A coronal heat spreader 107 is attached to the substrate 101 and the central segment 106 of molding compound with a thermal glue 108. The coronal heat spreader 107 is laterally surrounded by a ring segment 109 of molding compound.

FIG. 2 shows a top cross-sectional view of the packaged device 100 of FIG. 1 along the plane indicated by the dashed line 110 of FIG. 1. FIG. 2 shows, on the plane of the dashed line 110 and going out from the center, the die 103 in the center, then the die-attach adhesive 104, then the central segment 106 of molding compound with cross-sections of the bond wires 105 visible inside, then the coronal heat spreader 107, and then the ring segment 109 of molding compound. Further out, the substrate 101, which is below the plane represented by the dashed line 110, is also visible.

During operation or in use, the die 103 generates heat, which dissipates through various pathways. Some of that heat dissipates through the die-attach adhesive 104 to the substrate 101. From the substrate 101, some of that heat dissipates to the surrounding atmosphere and the solder balls 102, and some of the heat dissipates from the substrate 101 to the coronal heat spreader 107, which is attached to the substrate 101 with the thermal glue 108. Some of the heat generated by the die 103 dissipates out to the central segment 106 of molding compound and from there to the coronal heat spreader 107. The coronal heat spreader 107 is highly thermo-conductive and efficiently dissipates that heat to the surrounding atmosphere.

FIGS. 3-5 show cross-sectional side views (A) and top views (B) of steps of an exemplary assembly process for the packaged IC device 100 of FIG. 1.

Figure 3A:
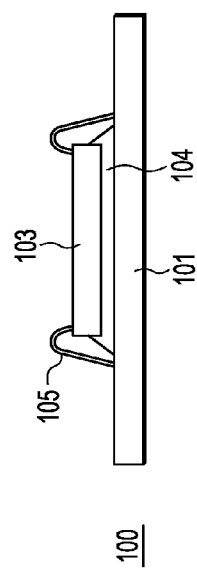
FIG. 3(A) shows a cross-sectional side view of an assembly step for the packaged device of FIG. 1.
Figure 3B:
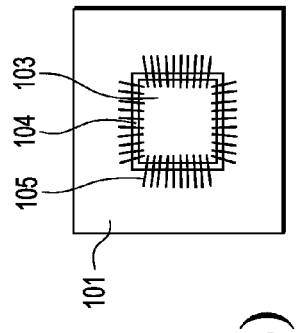
FIG. 3(B) shows a corresponding top view of the assembly step of FIG. 3(A)

FIG. 3(A) shows a cross-sectional side view of an assembly step after the die 103 has been attached to the substrate 101 with the die-attach adhesive 104, and the die 103 has been electrically connected to the substrate 101 with the bond wires 105. FIG. 3(B) shows the corresponding top view of the assembly step of FIG. 3(A).

Figure 4A:
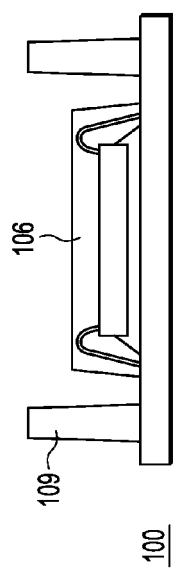
FIG. 4(A) shows a cross-sectional side view of an assembly step for the packaged device of FIG. 1.
Figure 4B:
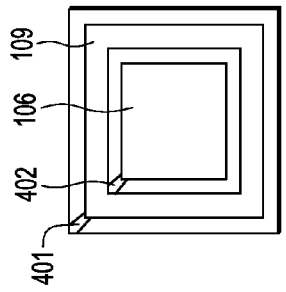
FIG. 4(B) shows a corresponding top view of the assembly step of FIG. 4(A)

FIG. 4(A) shows a cross-sectional side view of an assembly step after the die 103 has been (i) encapsulated by the central segment 106 of molding compound and (ii) laterally surrounded by the ring segment 109 of molding compound. FIG. 4(B) shows the corresponding top view of the assembly step of FIG. 4(A). FIG. 4(B) shows an outer mold gate 401 and an inner mold gate 402. The segments 106 and 109 are formed together in one transfer-molding step. The molding gates 401 and 402 are artifacts of the manufacturing process indicating the channels through which the then-liquid molding compound flowed into molding-die voids to form the segments 106 and 109. One or both of the mold gates 401 and 402 may be removed as part of the manufacturing process. Note that it may be particularly costly to remove the inner mold gate 402. If the inner mold gate 402 is not removed, then the coronal heat spreader 107 would have a corresponding notch, or relief feature, so as to properly fit over the inner mold gate 402 and into the slot. Note that the volume of the notch may be up to several times larger than the volume of the inner mold gate 402 since the gap between the inner mold gate 402 and the coronal heat spreader 107 may be filled with the thermal glue 108.

Figure 5A:
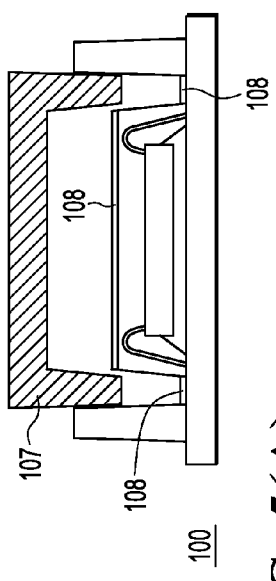
FIG. 5(A) shows a cross-sectional side view of an assembly step for the packaged device of FIG. 1.

FIG. 5(A) shows a cross-sectional side view of an assembly step after the application of thermal glue to sections of the central segment 106 of molding compound and the substrate 101 for the attachment of the coronal heat spreader 107. The coronal heat spreader 107 is shown about to be inserted into the slot formed between the segments 106 and 109 of molding compound. Incorporating the heat spreader 107 into the packaged device 100 at this stage of manufacture—after encapsulation, rather than earlier, allows for reduced accuracy—i.e., increased tolerance—in the dimensions and placement of the heat spreader 107 because, for example, the molding compound segments 106 and 109 are larger and more malleable than the die 103.

A reduced requirement for accuracy may lead to reduced production costs as components may be made quicker and/or cheaper if lesser accuracy is allowed. In addition, adding the heat spreader after encapsulation allows for the use of a thicker and larger heat spreader that is a more effective heat dissipater since the heat spreader does not to be as flexible— and, consequently, as thin—as in conventional pre-encapsulation incorporations. In some implementations, the thickness of the upper segment of the coronal heat spreader 107, from approximately the top of the central segment 106 of molding compound to the top of the upper segment of heat spreader 107 is greater than 0.4 mm, and preferably between 0.5 mm and 1.0 mm.

Another potential benefit of the incorporation of the heat spreader 107 at this stage is that it reduces the chances that the die 103 will crack from the pressure applied to attach the heat spreader 107 to the packaged device 100. A benefit of including the ring segment 109 of molding compound in packaged device 100 is that the outer dimensions of the ring segment 109 can be modified relatively easily and cheaply—compared to modifying the dimensions of the heat spreader 107—to match any required external dimensions for the packaged device 100. This means that same-dimensioned heat spreaders may be used in the fabrication of differently dimensioned packaged devices. This may allow for cost savings by, for example, (i) reducing the per-piece costs of more numerous heat spreaders and (ii) reducing the costs of generating packaged devices of different dimensions.

Figure 5B:
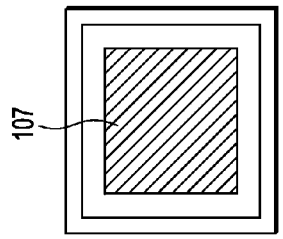
FIG. 5(B) shows a corresponding top view of the assembly step of FIG. 5(A)

FIG. 5(B) shows the corresponding top view of the assembly step shown in FIG. 5(A). In an additional step (not shown), the solder balls 102 are attached to the substrate 101. Furthermore, singulation—the separating into individual packaged devices of a plurality of packaged devices fabricated together on a single substrate—may then take place.

Figure 6:
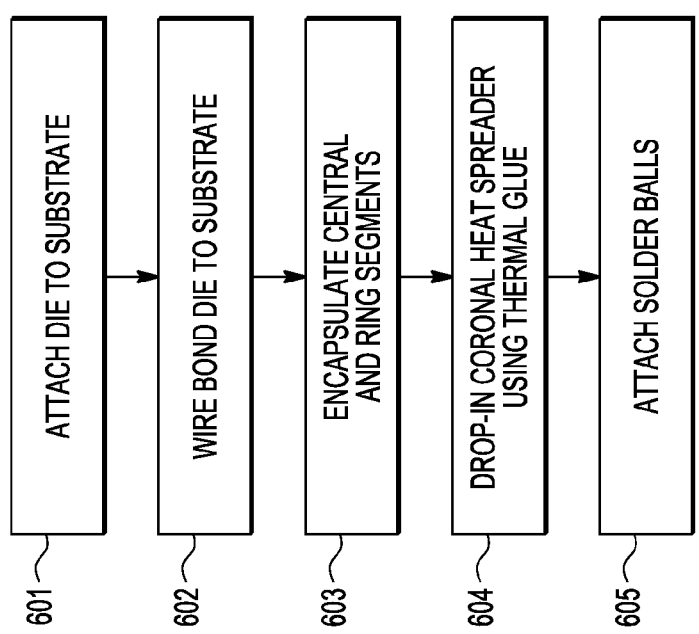
FIG. 6 shows a flow chart of the above-described exemplary assembly process of FIGS. 3-5.

FIG. 6 is a flow chart 600 of the above-described exemplary assembly process of FIGS. 3-5. In step 601, the die 103 is attached to the substrate 101. Then, in step 602, the die 103 is wire bonded to the substrate 101. Next, in step 603, the central segment 106 and the ring segment 109 are formed using molding compound to generate the slot for the coronal heat spreader 107. Then, in step 604, the coronal heat spreader 107 is dropped in and attached to the substrate 101 and the molding compound using thermal glue. Finally, in step 605, the solder balls 102 are attached.

Figure 7:
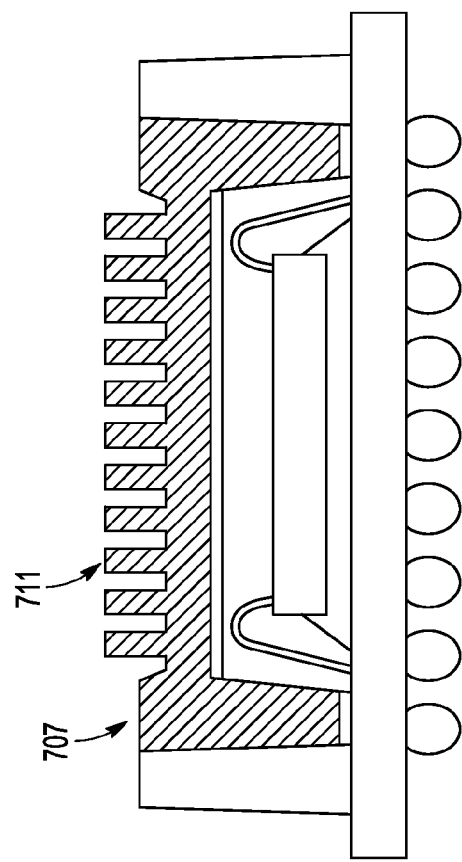
FIG. 7 shows a cross-sectional side view of a packaged IC device in accordance with an alternative embodiment of the present invention.

FIG. 7 shows a cross-sectional side view of a packaged IC device 700 in accordance with an alternative embodiment of the present invention. The packaged device 700 is substantially similar to the packaged device 100 of FIG. 1, but with the coronal heat spreader 107 replaced by a coronal heat spreader 707. The lower segment of coronal heat spreader 707 is substantially similar to the lower segment of coronal heat spreader 107, but the upper segment of coronal heat spreader 707—unlike the substantially flat upper segment of coronal heat spreader 107—includes a plurality of fins 711. The fins 711 increase the surface area of the upper segment of coronal heat spreader 700, which is exposed to the surrounding atmosphere and, consequently, increases the rate of dissipation of heat from the coronal heat spreader 700.

Exemplary embodiments have been provided using die-attach adhesive and molding compound. Note that, generally, any known die-attach adhesive and molding compound may be used. In some embodiments, the die-attach adhesive and/or the molding compound materials have relatively high thermal conductivity, which enhances heat dissipation.

Exemplary embodiments have been provided where the central segment 106 and the ring segment 109 of molding compound are made at the same time and from the same material. The invention, however, is not so limited. In some alternative embodiments, the central segment 106 and the ring segment 109 are made separately in two separate and distinct manufacturing steps. In some alternative embodiments, the central segment 106 and the ring segment 109 are made from different compositions of molding compounds.

Exemplary embodiments have been provided where the IC die 103 is electrically connected to the substrate 101 with bond wires 105. The invention, however, is not limited to wire-bond interconnects. Alternative embodiments may comprise alternative electrical interconnects such as, for example, the solder balls used in flip-chip packages.

Exemplary embodiments have been provided that use transfer molding to manufacture molding-compound segments of packaged devices. The invention is not, however, limited to transfer molding. Other molding techniques, such as, for example, injection molding or compression molding, may be used instead of, or in addition to, transfer molding.

Exemplary embodiments have been provided where the embodiments relate to BGA packages. The invention, however, is not limited to BGA packages. Alternative embodiments may comprise other similar IC packages such as pin grid array (PGA) and land grid array (LGA) packages.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device, comprising:
a substrate;
a die attached to the substrate;
a heat spreader having a lower segment and an upper segment;
a central segment of molding compound encapsulating the die and attached to the substrate;
a ring segment of molding compound attached to the substrate, wherein:
the central segment of molding compound is substantially separated from the ring segment of molding compound by the lower segment of the heat spreader; and
the upper segment of the heat spreader forms part of the exterior of the packaged device; and
a mold gate attached to the substrate and connecting the ring segment of molding compound to the central segment of molding compound, wherein the lower segment of the heat spreader has a notch corresponding to the mold gate.

2. The packaged device of claim 1, wherein the lower segment of the heat spreader is attached with thermal glue to the substrate, and inserted between the central segment of molding compound and the ring segment of molding compound.

3. The packaged device of claim 1, wherein the upper segment of the heat spreader has a substantially planar top.

4. The packaged device of claim 3, wherein the top of the upper segment of the heat spreader is substantially flat with the top of the ring segment of molding compound.

5. The packaged device of claim 3, wherein the thickness of the upper segment of the heat spreader, from the top of the central segment of the molding compound to the top of the upper segment, is greater than 0.4 mm.

6. The packaged device of claim 1, wherein the heat spreader is a coronal heat spreader that caps the central segment of molding compound.

7. The packaged device of claim 1, further comprising a plurality of bond wires, wherein the die is electrically connected to the substrate with the plurality of bond wires.

8. The packaged device of claim 7, wherein the central segment of molding compound also encapsulates the plurality of bond wires.

9. The packaged device of claim 1, wherein:
the packaged device is a flip-chip device; and
the die is electrically connected to the substrate via a plurality of solder balls.

10. The packaged device of claim 1, further comprising a plurality of solder balls connected to the substrate for mounting the packaged device on a circuit board.

11. The packaged device of claim 1, wherein the heat spreader comprises copper.

12. The packaged device of claim 1, wherein the molding compound of the central segment is the same as the molding compound of the ring segment.

13. The packaged device of claim 1, wherein the central segment of molding compound is separated from the ring segment of molding compound by a moat-like trough within which the heat spreader is positioned.

14. A method for packaging an integrated circuit (IC) device, the method comprising:
attaching a die to a substrate;
attaching a mold gate to the substrate;
encapsulating the die with a central segment of molding compound also attached to the substrate through the mold gate;
forming a ring segment of molding compound attached to the substrate wherein the ring segment is separated from the central segment by a moat-like trough, and wherein the mold gate connects the ring segment of molding compound to the central segment of molding compound; and
attaching a heat spreader having a lower segment and an upper segment, wherein the lower segment substantially fills the trough between the ring segment of molding compound and the central segment of molding compound and the upper segment forms part of the exterior of the packaged device, and wherein the lower segment of the heat spreader has a notch corresponding to the mold gate.

* * * * *